US011209935B1

(12) United States Patent
Lu et al.

(10) Patent No.: US 11,209,935 B1
(45) Date of Patent: Dec. 28, 2021

(54) METHOD FOR UPDATING ENVIRONMENTAL THRESHOLD IN TOUCH SENSING, TOUCH SENSOR, AND WATER OUTLET DEVICE

(71) Applicant: Xiamen Solex High-Tech Industries Co., Ltd., Xiamen (CN)

(72) Inventors: Sihua Lu, Xiamen (CN); Jun Liu, Xiamen (CN); Yuemin Wang, Xiamen (CN)

(73) Assignee: Xiamen Solex High-Tech Industries Co., Ltd., Xiamen (CN)

( * ) Notice: Subject to any disclaimer, the term of this patent is extended or adjusted under 35 U.S.C. 154(b) by 0 days.

(21) Appl. No.: 17/240,071

(22) Filed: Apr. 26, 2021

(30) Foreign Application Priority Data

Jun. 16, 2020 (CN) .......................... 202010549120.2

(51) Int. Cl.
   *G06F 3/041* (2006.01)
   *E03C 1/05* (2006.01)
(52) U.S. Cl.
   CPC ............ *G06F 3/0418* (2013.01); *E03C 1/055* (2013.01)
(58) Field of Classification Search
   CPC .................................................... G06F 3/0418
   See application file for complete search history.

(56) References Cited

U.S. PATENT DOCUMENTS

| 2011/0157076 A1* | 6/2011 | Chang | H03K 17/962 345/174 |
| 2011/0310064 A1* | 12/2011 | Keski-Jaskari | G06F 3/0418 345/178 |
| 2012/0256875 A1* | 10/2012 | Ho | G06F 3/0445 345/174 |
| 2013/0127756 A1* | 5/2013 | Wang | G06F 3/0418 345/173 |

FOREIGN PATENT DOCUMENTS

EP           3816776 A1 *  5/2021   ........... G06F 3/0416

\* cited by examiner

*Primary Examiner* — Michael Pervan
(74) *Attorney, Agent, or Firm* — Cooper Legal Group, LLC

(57) ABSTRACT

The present disclosure discloses a method for updating an environmental threshold in touch sensing, a touch sensor, and a water outlet device. The method repeatedly collects a detection value until a difference obtained by comparing the detection value collected at an Nth repetition with a current environmental threshold is greater than a first threshold and a current value of a counter is greater than a second threshold and then updates the detection value collected at the Nth repetition to the current environmental threshold. In this way, the environmental threshold can be dynamically updated according to environmental changes, thereby reducing incorrect operations.

5 Claims, 1 Drawing Sheet

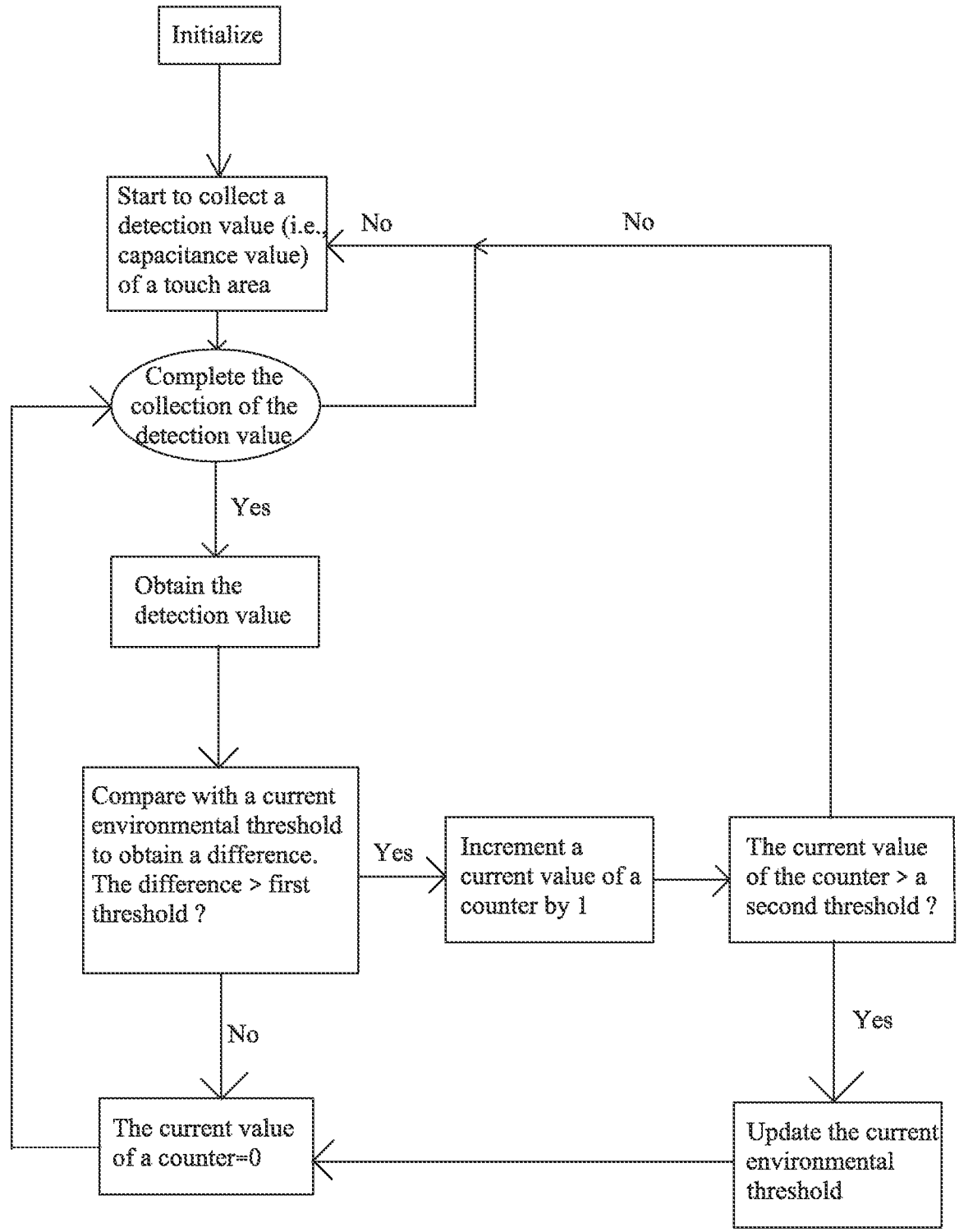

METHOD FOR UPDATING ENVIRONMENTAL THRESHOLD IN TOUCH SENSING, TOUCH SENSOR, AND WATER OUTLET DEVICE

RELATED APPLICATIONS

This application claims priority to Chinese patent application number 202010549120.2, filed on Jun. 16, 2020. Chinese patent application number 202010549120.2 is incorporated herein by reference.

FIELD OF THE DISCLOSURE

The present disclosure relates to a sensor, and in particular to a touch sensor.

BACKGROUND OF THE DISCLOSURE

In the past, electrostatic capacitive touch sensors have been known as data input devices for various electronic devices such as mobile phones, mobile audio equipment, portable game equipment, televisions, and personal computers.

When a human finger touches or approaches a touch panel with the electrostatic capacitive touch sensor, the electrostatic capacitive touch sensor detects a change of capacitance of the touch panel due to the above-mentioned actions to realize contact detection.

Since an output value of the electrostatic capacitive touch sensor changes sensitively according to an environment (such as according to temperature, humidity, electric field from surrounding environment, etc.) in which the electrostatic capacitive touch sensor is being used, it is necessary to adjust a sensor input offset or a sensor output offset. This process is called calibration.

In the related art, most algorithms do not collect multiple values when updating a noise threshold generated by the environment, but update the noise threshold directly according to temporary changes in the environment, which may easily cause false touches. In addition, some algorithms directly judge a maximum change value of capacitance without environmental judgment, but environmental changes will cause the maximum change value of capacitance to change, which may cause product instability.

BRIEF SUMMARY OF THE DISCLOSURE

The main technical problem to be solved by the present disclosure is to provide a method for updating an environmental threshold in touch sensing, which can dynamically update the environmental threshold according to environmental changes, thereby reducing incorrect operations.

In order to solve the above technical problems, the present disclosure provides a method for updating the environmental threshold in touch sensing, which comprises the following steps:

1) repeatedly collecting a detection value of a touch area when the touch area is not touched and obtaining the detection value during each repetition;

2) comparing the detection value collected at an Nth repetition with a current environmental threshold to obtain a difference and comparing the difference with a first threshold; when the difference is less than the first threshold, repeating step 1; and when the difference is greater than the first threshold, going to step 3; and 3) incrementing a current value of a counter by 1 and comparing the current value of the counter with a second threshold; when the current value of the counter is less than the second threshold, maintaining the current value of the counter and repeating step 1 and step 2; and when the current value of the counter is greater than the second threshold, updating the detection value collected at the Nth repetition to the current environmental threshold, clearing the counter, and repeating step 1 and step 2.

In an embodiment, when the current value of the counter is less than the second threshold, the method comprises clearing the counter when the difference is less than the first threshold.

In an embodiment, the difference is obtained by subtracting the detection value collected at the Nth repetition from the current environment threshold and taking an absolute value.

The present disclosure further provides a touch sensor, comprising:

a sensor circuit that detects a detection value of a touch area;

a calibration register that uses the aforementioned method to update an environmental threshold; and a control circuit that compares the environmental threshold stored in the calibration register with the detection value detected by the sensor circuit to determine whether the touch area is touched.

The present disclosure further provides a water outlet device, comprising: a water outlet device body and a control box, wherein the control box is provided with the aforementioned touch sensor, and the touch sensor is electrically connected with the touch area, which is disposed on the water outlet device body.

Compared with the related art, the technical solution of the present disclosure has the following beneficial effects.

The present disclosure provides a method for updating the environmental threshold in touch sensing. The detection value of the touch area is detected repeatedly, and the detection value is compared with the current environmental threshold, so that the environmental threshold is updated in time when the detection value is significantly greater than the environmental threshold, thus avoiding the occurrence of false touches. This dynamic update process repeatedly collects the detection value until the difference is greater than the first threshold and the current value of the counter is greater than the second threshold, thereby avoiding the environmental threshold from changing due to temporary changes in the environment, making the entire system more stable.

BRIEF DESCRIPTION OF THE DRAWINGS

FIG. 1 is a flowchart of a method according to an embodiment of the present disclosure.

DETAILED DESCRIPTION OF THE EMBODIMENTS

The present disclosure will be further described in detail below with reference to the drawings and embodiments.

This embodiment provides a touch sensor, comprising:
a sensor circuit that detects a detection value (i.e., capacitance value) of a touch area;
a calibration register that is used to update an environmental threshold; and a control circuit that compares the environmental threshold stored in the calibration register with the detection value detected by the sensor circuit to determine whether the touch area is touched by a person.

Referring to FIG. 1, in the calibration register, in order to realize the update of the environmental threshold, a program comprising a method for updating the environmental threshold in touch sensing is stored, and the method comprises the following steps of:

1) repeatedly collecting a detection value (i.e., capacitance value) of a touch area when the touch area is not touched and obtaining the detection value during each repetition.

2) comparing the detection value collected at an Nth repetition with a current environmental threshold to obtain a difference and comparing the difference with a first threshold; when the difference is less than the first threshold, repeating step 1; and when the difference is greater than the first threshold, going to step 3; and 3) incrementing a current value of a counter by 1 and comparing the current value of the counter with a second threshold; when current value of the counter is less than the second threshold, maintaining the current value of the counter and repeating step 1 and step 2; and when the current value of the counter is greater than the second threshold, updating the detection value collected at the Nth repetition to the current environmental threshold, clearing the counter, and repeating step 1 and step 2.

In particular, when the current value of the counter is less than the second threshold, the counter is cleared when the difference is less than the first threshold. In this way, when the detection value continuously increases, it is judged that the environmental threshold increases. The environmental threshold does not change when the detection value merely increases intermittently, which makes the touch sensor more stable.

In this embodiment, in order to enable the environmental threshold to be dynamically increased or decreased, the difference is obtained by subtracting the detection value collected at the Nth repetition from the current environment threshold and taking an absolute value.

As an application of this embodiment, a water outlet device is also provided.

The water outlet device comprises a water outlet device body and a control box. The control box is provided with the touch sensor as described above, and the touch sensor is electrically connected with the touch area, which is disposed on the water outlet device body.

The water outlet device body can be a shower, a kitchen faucet, a bathroom faucet, etc. As a simple replacement, this touch sensor can also be applied to other products, such as touch-sensitive lights, etc., which are all simple replacements of this embodiment.

It will be apparent to those skilled in the art that various modifications and variations can be made in the present disclosure without departing from the spirit or scope of the disclosure. Thus, it is intended that the present disclosure cover the modifications and variations of this disclosure provided they come within the scope of the appended claims and their equivalents.

What is claimed is:

1. A method for updating an environmental threshold in touch sensing, comprising the following steps:
   1) repeatedly collecting a detection value of a touch area when the touch area is not touched and obtaining the detection value each repetition;
   2) comparing the detection value collected at an Nth repetition with a current environmental threshold to obtain a difference and comparing the difference with a first threshold; when the difference is less than the first threshold, repeating step 1; and when the difference is greater than the first threshold, going to step 3; and
   3) incrementing a current value of a counter by 1 and comparing the current value of the counter with a second threshold; when the current value of the counter is less than the second threshold, maintaining the current value of the counter and repeating step 1 and step 2; and when the current value of the counter is greater than the second threshold, updating the detection value collected at the Nth repetition to the current environmental threshold, clearing the counter, and repeating step 1 and step 2.

2. The method for updating the environmental threshold in touch sensing according to claim 1, comprising:
   when the current value of the counter is less than the second threshold, clearing the counter when the difference is less than the first threshold.

3. The method for updating the environmental threshold in touch sensing according to claim 1, wherein:
   the difference is obtained by subtracting the detection value collected at the Nth repetition from the current environment threshold and taking an absolute value.

4. A touch sensor, comprising:
   a sensor circuit that detects the detection value of the touch area;
   a calibration register that uses the method according to the claim 1 to update the current environmental threshold; and
   a control circuit that compares the current environmental threshold stored in the calibration register with the detection value detected by the sensor circuit to determine whether the touch area is touched.

5. A water outlet device, comprising:
   a water outlet device body; and
   a control box, wherein:
      the control box is provided with the touch sensor according to claim 4, and
      the touch sensor is electrically connected with the touch area, which is disposed on the water outlet device body.

* * * * *